(12) United States Patent
Gershowitz

(10) Patent No.: US 9,863,616 B2
(45) Date of Patent: Jan. 9, 2018

(54) CIRCUIT BOARD FOR LED APPLICATIONS

(71) Applicant: Bridgelux, Inc., Livermore, CA (US)

(72) Inventor: Michael N. Gershowitz, San Jose, CA (US)

(73) Assignee: BRIDGELUX INC., Fremont, CA (US)

( * ) Notice: Subject to any disclaimer, the term of this patent is extended or adjusted under 35 U.S.C. 154(b) by 0 days.

(21) Appl. No.: 13/705,897

(22) Filed: Dec. 5, 2012

(65) Prior Publication Data

US 2013/0194815 A1    Aug. 1, 2013

Related U.S. Application Data

(60) Provisional application No. 61/592,563, filed on Jan. 30, 2012, provisional application No. 61/594,341, filed on Feb. 2, 2012.

(51) Int. Cl.
| | |
|---|---|
| *H05K 1/02* | (2006.01) |
| *H05K 1/18* | (2006.01) |
| *F21V 21/00* | (2006.01) |
| *F21V 23/00* | (2015.01) |
| *H05K 1/05* | (2006.01) |

(52) U.S. Cl.
CPC ........... *F21V 21/00* (2013.01); *H05K 1/0209* (2013.01); *H05K 1/0256* (2013.01); *F21V 23/004* (2013.01); *H05K 1/056* (2013.01); *H05K 1/18* (2013.01); *H05K 2201/09027* (2013.01); *H05K 2201/09063* (2013.01); *H05K 2201/09781* (2013.01); *H05K 2201/10106* (2013.01)

(58) Field of Classification Search
CPC .... F21V 21/00; H05K 1/0209; H05K 1/0256; H05K 1/056; H05K 2201/09781; H05K 2201/09063; H05K 2201/10106; H05K 2201/09027; F21Y 2105/001; F21Y 2101/02; F21K 9/13
USPC ......... 174/250–268; 361/760, 792–795, 748; 362/249.1, 249.2, 249.11
See application file for complete search history.

(56) References Cited

U.S. PATENT DOCUMENTS

| | | | | |
|---|---|---|---|---|
| 4,031,313 | A * | 6/1977 | Franz et al. ................. | 174/258 |
| 4,518,646 | A * | 5/1985 | Nichols, Jr. ................. | 442/237 |
| 5,285,352 | A * | 2/1994 | Pastore et al. ............... | 361/707 |
| 6,804,119 | B2 * | 10/2004 | Ziemkowski ...... | H01R 13/6485 |
| | | | | 361/715 |
| 6,822,468 | B2 * | 11/2004 | Braun et al. ............ | 324/763.01 |
| 7,243,038 | B2 * | 7/2007 | Dowland et al. ............ | 702/115 |
| 7,291,037 | B2 * | 11/2007 | Tsai ..................... | H01R 12/592 |
| | | | | 174/254 |
| 7,439,548 | B2 | 10/2008 | Shum | |
| 7,808,013 | B2 * | 10/2010 | Mendendorp et al. ......... | 257/99 |
| 7,897,980 | B2 * | 3/2011 | Yuan ........................ | F21K 9/00 |
| | | | | 257/79 |
| 7,939,846 | B2 | 5/2011 | Chen | |
| 8,013,501 | B2 | 9/2011 | Carroll | |
| 8,174,196 | B2 * | 5/2012 | Lin et al. .................... | 315/33 |
| 8,203,080 | B2 * | 6/2012 | Vasoya ................ | H05K 3/4608 |
| | | | | 174/255 |
| 8,492,776 | B2 * | 7/2013 | Nagai ............................ | 257/88 |

(Continued)

*Primary Examiner* — Ishwarbhai B Patel
(74) *Attorney, Agent, or Firm* — Arent Fox LLP

(57) ABSTRACT

Circuit boards are designed and configured for mounting light emitting devices (LEDs), such as for LED light bulb and LED light tube applications, and are capable of passing a non-isolated, mains powered, electrical strength test.

20 Claims, 12 Drawing Sheets

(56) References Cited

U.S. PATENT DOCUMENTS

| | | | |
|---|---|---|---|
| 8,841,838 B2 * | 9/2014 | Konishi | F21K 9/00 313/505 |
| 2008/0170396 A1 * | 7/2008 | Yuan | F21K 9/00 362/244 |
| 2009/0080184 A1 * | 3/2009 | Kobilke | 362/227 |

* cited by examiner

CIRCUIT BOARD FOR LED APPLICATIONS

PRIORITY CLAIM

This application claims the benefit of priority from commonly-owned U.S. Provisional Patent Application Ser. No. 61/592,563, entitled "Circuit Board for LED Applications" and filed on Jan. 30, 2012, and from commonly-owned U.S. Provisional Patent Application Ser. No. 61/594,341, entitled "Circuit Board for LED Applications" and filed on Feb. 2, 2012, both of which are fully incorporated herein by reference for all purposes.

BACKGROUND

Field of the Application

This disclosure generally relates to circuit boards, and more specifically to a circuit board used in light emitting device (LED) applications.

Background of the Disclosure

Light emitting devices (LEDs) are becoming a part of everyday life. LEDs are used in widely-varying applications, such as traffic lights, Christmas lights, automotive indicator lights, walk/don't walk and exit signs, flashlights and indoor/outdoor utility lighting. In this last category, indoor/outdoor lighting, LEDs are used in such items as: indoor tubes to replace fluorescent tubes, stage lights, indoor/outdoor display lights, outdoor flood lights and indoor screw-in light bulbs.

Because some LED lights are replacements for already-existing products (like bulbs and tubes), the general form-factor for the LED products is somewhat defined. For example, an LED light bulb that replace a regular, screw-in incandescent bulb should be of about the same shape and size as the regular light bulb and have the same screw-in threads as the regular bulb. Therefore, the inner workings of each type of LED light are mostly constrained to the form-factor of each type of light it replaces. LED light bulb parts like LED diodes or LED arrays, the light diffusers and transmitters, any power supply or other electronics, the circuit board(s) on which the LED(s), LED array(s) and/or other electronics may be mounted, and any heat dissipating sinks all should to fit within the general size and shape of the regular bulb it replaces.

Additionally, because LED light bulbs (or tubes) are replacing already existing bulbs (or tubes), their safety, reliability and durability should be at least equal to the standards and expectations set by the light bulbs (or tubes) they are replacing. Safety tests exist, such as those defined by Underwriters Laboratories, Inc., which are used for certifying both incandescent and LED light bulbs (as well as fluorescent and LED tubes) and include tests like: environmental sealing, mechanical strain relief and electrical strength or dielectric withstand.

In the context of circuit boards for LED lighting applications, electrical strength or dielectric withstand voltage is affected by the electrical creepage distance, which is the shortest path between two conductive parts (or between a conductive part and a conductive mounting piece) of an LED bulb or pieces of the bulb measured along the surface of the insulation or insulator. Proper creepage distance helps protect components and users by ensuring that conductive parts of the LED light, which are not supposed to conduct electricity between them, do not conduct electricity (or electrical arcing) under certain testing and/or operating conditions of the LED bulb or tube. Likewise, proper creepage distance can help prevent a shocking hazard by ensuring that conductive parts of the LED light do not conduct electricity (or electrical arcing) with the mounting structure(s) of the LED bulb under certain testing and/or operating conditions.

For non-isolated, mains powered, replacement LED light bulbs, creepage might be problematic, especially for the small circuit board on which an LED diode or LED array (and/or other electronics) may be mounted. Such a circuit board should be small enough to fit within the dimensions of the bulb or tube it is replacing and yet still include proper creepage distances needed to pass electrical strength certifications when tested for non-isolated, mains powered applications. For example, an isolated, mains powered creepage test may only require sustaining about 500 volts AC without electrical arcing, yet a non-isolated, mains powered creepage test may require sustaining from about 1,240 volts AC (United States testing) to more than 3,700 volts AC (European testing) without arcing between conductive pieces of the circuit board and/or the enclosure in which the circuit board may be mounted (i.e., the enclosure of an LED light bulb).

Therefore what is needed is a circuit board on which an LED diode or LED array (and/or supporting electronics) may be mounted, which fits and functions within the application of a replacement light bulb (or tube), and passes non-isolated, mains powered, electrical creepage testing.

DETAILED DESCRIPTION

Figure 1:
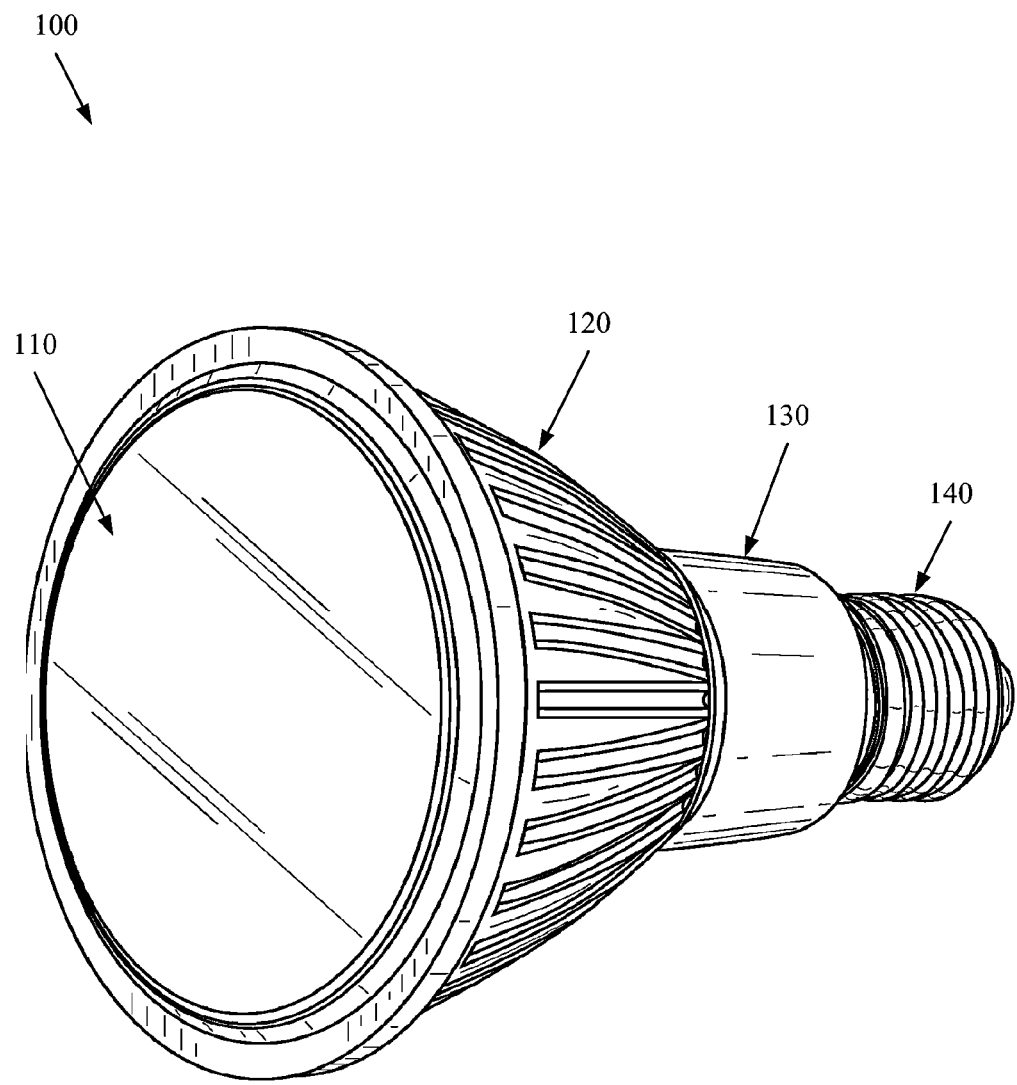
FIG. 1 illustrates an exemplary replacement light emitting device (LED) light bulb in which certain embodiments of the disclosure may be used.

The following detailed description is directed to certain exemplary embodiments. However, the disclosure can be embodied in a multitude of different ways as defined and covered by the claims. In this description, reference is made to the drawings wherein like parts are designated with like reference numerals throughout.

FIG. 1 illustrates an exemplary replacement light emitting device (LED) light bulb 100 in which certain embodiments of the disclosure may be used. As shown in FIG. 1, bulb 100 has the same general size and shape as a regular, incandescent light bulb, but looks somewhat different. The top of bulb 100, from where light emerges, includes a light diffuser 110. The outer sides along the larger, top/middle portion of bulb 100 include a heat sink 120 for helping to dissipate heat produced by the internal components, predominately by an LED or LED array and/or other electronic components that may be mounted on one or more circuit boards (not shown). The bottom of bulb 100 includes screw threads 140, as on a regular incandescent bulb, inside of which may be power control electronics (not shown) for converting the external, supply electricity into a voltage and/or current compatible with the LED light-producing circuitry. The portion of bulb between heat sink 120 and screw threads 140 is a housing 130 that may contain LED driver circuitry (not shown) that can be mounted on a circuit board (not shown) and possibly encapsulated in electrically, non-conductive potting material.

Circuit boards, in general, are used to electrically connect components using various conductive pathways that are laminated onto and/or between one or more non-conductive layers. Additionally, circuit boards provide mechanical support and at least partial environmental protection for the components. The conductive pathways of the circuit board may be made of, for example, copper and may be patterned using techniques such as etching and/or printing. The non-conductive materials may be a ceramic dielectric, or other material like FR-4 (a woven, glass and epoxy material). Through-holes, or vias, may be drilled though the circuit board to facilitate electrical and/or thermal connection on opposite sides of the circuit board and/or the laminated, conductive, internal layer(s) of the circuit board. Circuit boards may also be shaped to form specific sizes and/or shapes, as well as deburred and/or smoothed. Other conductive and non-conductive materials, via-hole creation and patterning, laminating, shaping and finishing techniques may be known in the art and are meant to be included within the scope of this application.

Figure 2:
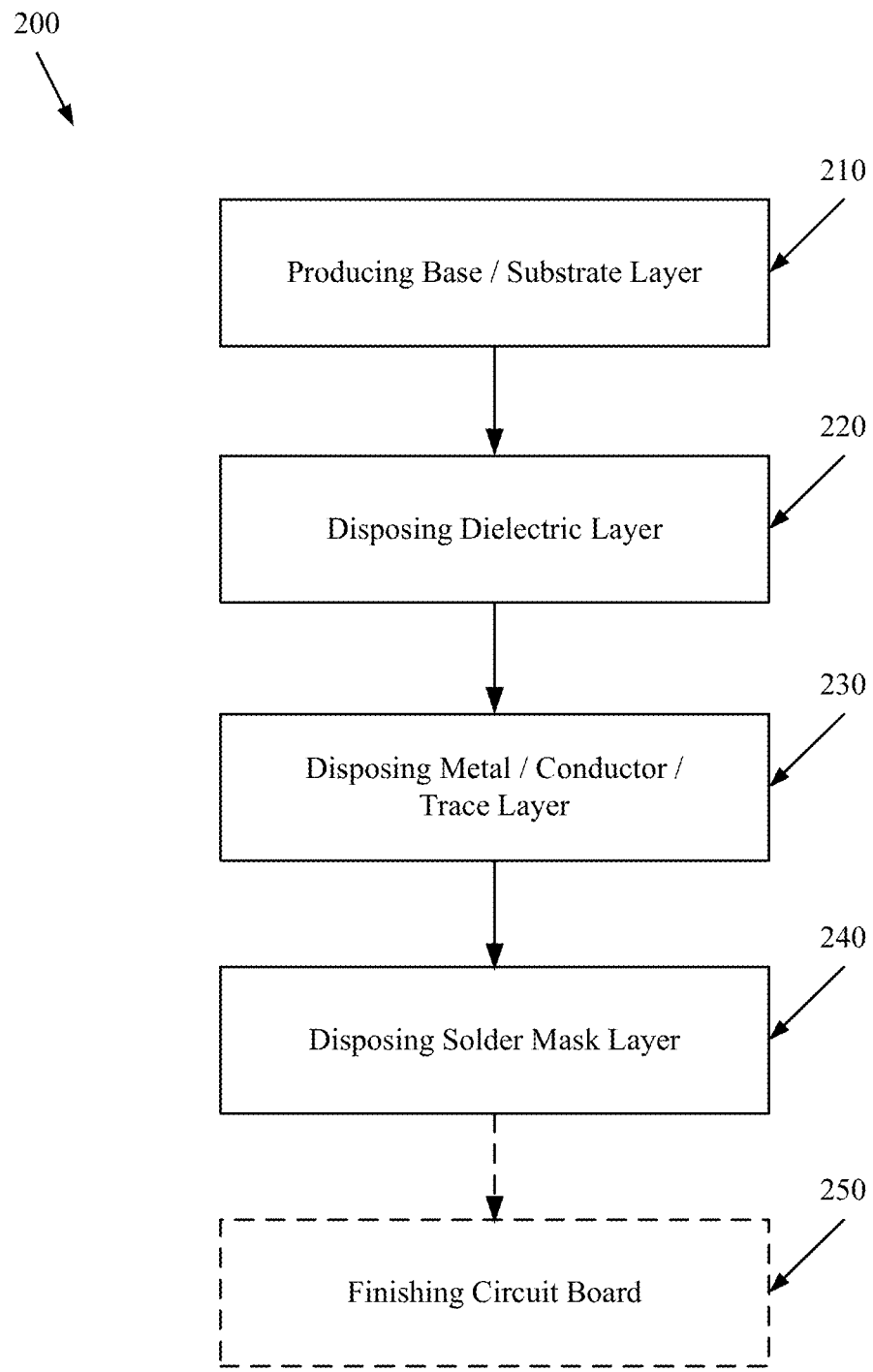
FIG. 2 illustrates an exemplary method for making an LED circuit board according to certain embodiments of the disclosure.

FIG. 2 illustrates an exemplary method 200 for making an LED circuit board according to certain embodiments of the disclosure. As shown in FIG. 2, at 210 a base layer or substrate layer is produced. The base layer may be, for example, aluminum, copper or silica-containing materials, and may be, for example, approximately 1.6 mm in thickness. As needed at 210, the surface(s) of the base layer may be smoothed, deburred and/or otherwise finished.

At 220, a dielectric layer is disposed on top of the base layer. The dielectric layer may be any insulator material (e.g., FR-4, etc.) suitable for providing electrical and/or thermal isolation between the base layer and the metal layer, and may be, for example, approximately 0.03 mm in thickness. As disposed, the dielectric layer may have a thermal conductivity of at least approximately 5 Watts per meter Kelvin (W/mK) and a voltage withstand of at least 1240 volts AC (VAC). The dielectric may be produced to include one or more excluded portions to help facilitate thermal conductivity (e.g., heat dissipation, etc.) between an LED or LED array that may be mounted on the circuit board and the base layer. As needed at 220, the surface(s) of the dielectric layer may be smoothed, deburred and/or otherwise finished.

At 230, a metal layer (or conductor layer, or trace layer, etc.) is disposed on top of the dielectric layer. The trace layer may be patterned (shown in more detail, below) to produce electrical and/or thermal connectivity, as desired for a particular LED application, between an LED diode or LED array that may be mounted on the circuit board, the external wires/circuits that may be connected to the circuit board, and/or the other layers (e.g., the base layer) of the circuit board. The metal layer may be, for example, copper, nickel aluminum and/or silver, and may be, for example, approximately 0.035 mm in thickness. As needed at 230, the surface(s) of the metal layer may be smoothed, deburred and/or otherwise finished.

At 240, a solder mask layer is disposed on top of the metal layer. The solder mask layer may be patterned to cover the entire top surface of the circuit board except for the desired pad areas (e.g., mounting, connecting, conducting, thermal, etc.) that remain exposed as required by the particular LED application. The solder mask layer may be any one of many suitable materials as are typically used for such purposes. As needed at 240, the surface(s) of the solder mask layer may be smoothed, deburred and/or otherwise finished.

At 250, and only as needed, the circuit board may be finished. The finishing may include shaping (e.g., cutting, drilling, etc.) the circuit board to produce the appropriate size and/or shape(s) for the LED application(s), removing burrs and/or sharp edges from the circuit board and/or smoothing the circuit board. Additional methods of making a circuit board, of which there are many, are known in the art and are meant to be included within the scope of this application for making the disclosed circuit board(s), and thus, are unnecessary detail for full disclosure in this application.

Figure 3:
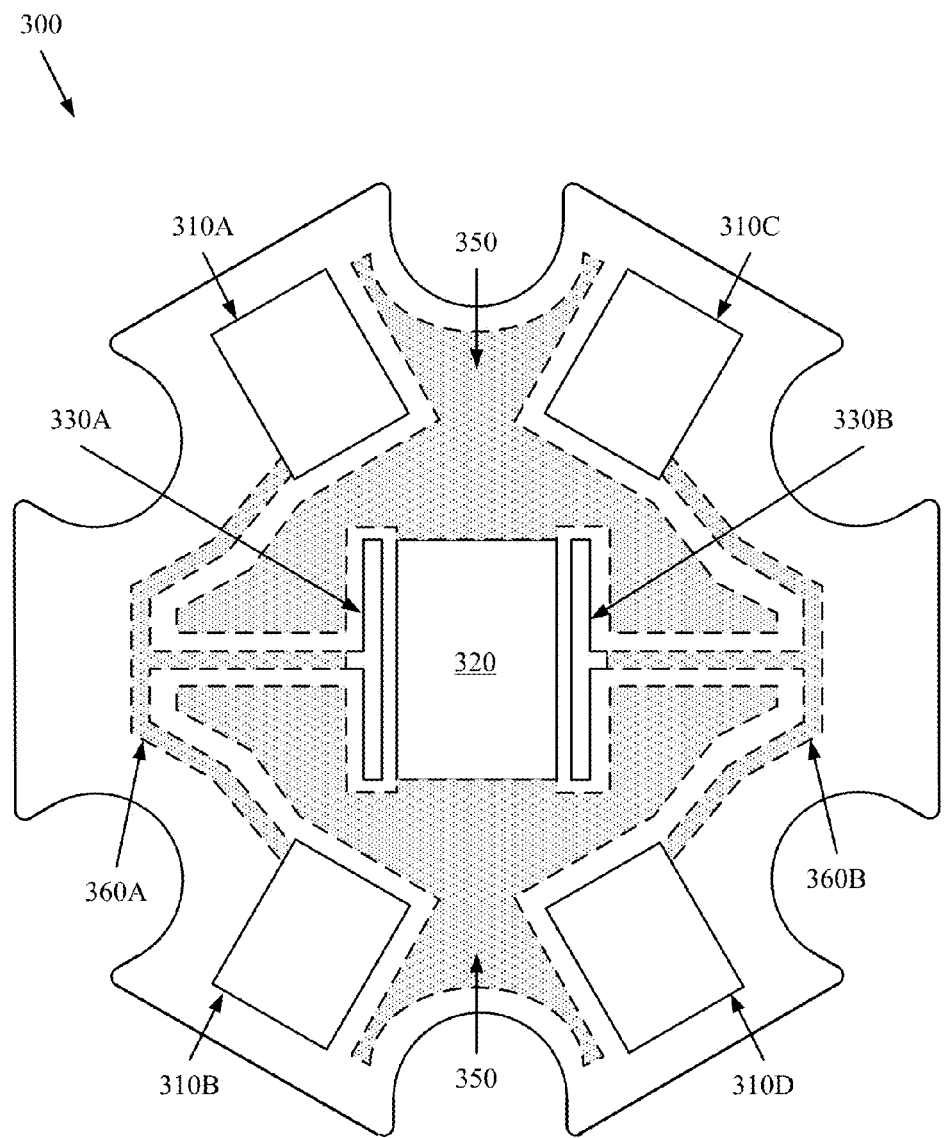
FIG. 3 illustrates an exemplary LED circuit board typically used in an LED light bulb.

FIG. 3 illustrates an exemplary LED circuit board 300 typically used in LED light bulb 100. As shown in FIG. 3, circuit board 300, as viewed from the top, is in the basic shape of a six-sided polygon, or hexagon, except for where the sides of the hexagon would normally join and come to a point (i.e., to form a corner), there are six, somewhat semi-circular cutouts. Circuit board 300 is thus said to be in a 'star' shape. Typically, one or more of the somewhat semi-circular cutouts may be used to facilitate mechanical security of circuit board 300 within LED light bulb 100, for example, by passing an attachment mechanism (e.g., threaded screw, rivet, etc.) through the cutout and into a support structure (not shown) and securing circuit board 300 at or adjacent to the inner edge of the cutout(s).

FIG. 3 illustrates at least two upper layers of circuit board 300. Not shown is one or more lower layers of circuit board 300, which may include a base layer of some thermally conductive material (e.g., copper, aluminum, silver, etc.) and a next-to-bottom, dielectric layer of an insulator material (e.g., ceramic, FR-4, silicon dioxide, etc.). Additionally not shown are various, possible vias, through-holes and/or other inter-layer connections or contact areas that may exist. The top, solder mask layer of circuit board 300 (e.g., which leaves some exposed portions of the conductive surface(s) of the next-to-top, metal layer) is illustrated with solid lines in FIG. 3, while the next-to-top, metal or trace layer (e.g., the conductive surface partially covered by the top, solder mask layer) is illustrated with dashed lines in FIG. 3. The conductive surface in this drawing is shown as a single conductive, metal layer. What differentiates the exposed and covered areas of the metal layer is the top, solder mask layer, which can be a non-conductive material, applied on top the entire top of circuit board 300, except for leaving selected areas, or pads, of the conductive, metal layer exposed for mounting, connecting and/or interconnecting other devices, e.g., wire(s), LED(s), LED array(s), and the like.

In FIG. 3, there are four connection pads 310A-D exposed by the solder mask top layer of circuit board 300. Connection pads 310 can be used for connecting (using solder, conductive adhesive, etc.) electrical conductors (wires, pins, etc., not shown) that extend externally from circuit board 300 and can, for example, supply power and/or signaling to circuit board 300. Towards the middle of circuit board 300, and also exposed by the top layer of circuit board 300, is a thermal pad 320. Thermal pad 320 can pass heat to a thermally conductive material on the bottom of circuit board 300, for example, from the bottom of an LED diode or multiple LED diodes mounted on a single substrate (i.e., an LED array). On two sides of thermal pad 320, exposed by the solder mask layer of circuit board 300, there are two (one on each side) conductive pads 330A-B. Conductive pads 330 can be used, for example, to connect with a mounted LED or LED array to supply power (neither shown). Finally, the remainder of the top layer of circuit board 300, which covers the non-exposed pad area of circuit board 300, can be some sort of insulator or non-conductive material (i.e., a solder mask), which can provide electrical insulation (along the top layer) to help protect the separate connection pads 310 from being short circuited to each other, conductive pads 330, thermal pad 320 and/or the base layer via an edge of circuit board 300. Such short circuiting might occur if a metal object (e.g., LED, LED array, screw, rivet, etc.) were improperly placed on top of circuit board 300 or if contamination (e.g., dust, dirt, grease, etc.) were to settle on circuit board 300.

At a layer beneath the top layer of circuit board 300, is a trace layer or metal layer, which is illustrated in FIG. 3 with dashed lines and hash marked area in-fill. As shown in FIG. 3, conductive traces 360A-B are laid out such that they make a conductive path from each exposed connection pad 310A-B and 310C-D to each exposed conductive pad 330A and 330B, respectively. Also shown is a single, large thermal trace 350, part of which is exposed by the solder mask layer as thermal pad 320.

In operation, circuit board 300 can have, for example, an LED diode or LED array mounted on it, at or near its center, such that electrical contacts on the underside of the LED or LED array align with and are electrically coupled (e.g., soldered, etc.) to conduction pads 330A-B, and such that thermal contact(s) on the underside of the LED or LED array align with and is thermally coupled to thermal pad 320. In this way, external power and/or signals that can be supplied to connection pads 310A-B and connection pads 310C-D will be transmitted to the LED or LED array via electrical traces 360A-B and conduction pads 330A-B, and heat created during operation can be dissipated through thermal pad 320 to the bottom, thermally conductive layer (not shown) and possibly to one or more external heat sinks.

For isolated, mains powered operation, circuit board 300 may operate safely, which can be demonstrated by passing safety tests like an electrical strength test (not including the gap between conduction pads 330 and thermal pad 320). For isolated, mains powered application, an electrical strength creepage test might only test circuit board 300 at 500 volts AC. However, for non-isolated, mains powered applications, circuit board 300 cannot pass an electrical strength test, which includes testing at about 1,240 volts AC (or at about 3,710 volts for European applications). Because of the proximity of connection pads 310A-D to the edges of circuit board 300 (i.e., the outer edges and the inner, semicircular cutout edges), electrical arcing occurs during the non-isolated, electrical strength test from connection pads 310A-D, over the non-conductive portion of the top layer (e.g., the solder mask), to the bottom layer of circuit board 300. This type of arcing poses a safety risk since the arc current is flowing toward/near the external housing of the device and the support structure, and may ultimately shock a person handling the device at the time of the arcing. Additionally, because of the proximity of conduction pads 330A-B to thermal pad 320, electrical arcing may occur between them during the isolated and non-isolated electrical strength test. However, this type of arcing, while a testing/certification failure, may not pose a safety risk or shock hazard (i.e., it is internal to the circuit board). Thus, circuit board 300 creates unsafe conditions for use in non-isolated, mains powered, LED lighting applications, and creates test failures during isolated, mains powered, LED lighting applications.

Figure 4:
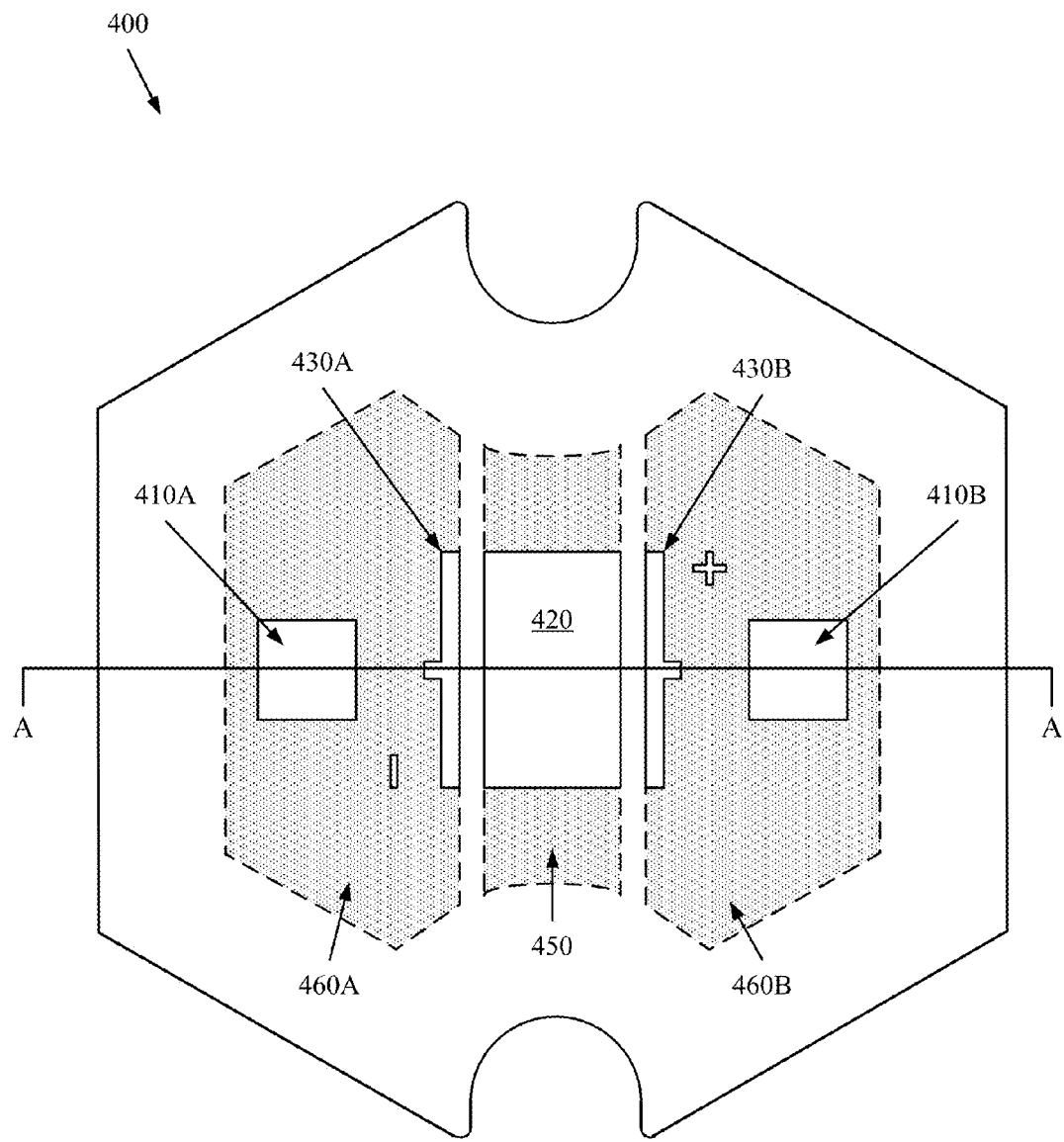
FIG. 4 illustrates a top view of an exemplary LED circuit board that may be used in an LED light bulb or tube according to certain embodiments of the disclosure.

FIG. 4 illustrates a top view of an exemplary LED circuit board 400 that may be used in LED light bulb 100 or tube according to certain embodiments of the disclosure. As shown in FIG. 4, circuit board 400 has similar general dimensions and layering make-up as circuit board 300, and thus, the two boards can fit, physically, in similar LED lighting applications. However, unlike circuit board 300, as will be discussed in further detail below, circuit board 400 is suited for use in non-isolated, mains powered, LED lighting applications.

As shown in FIG. 4, circuit board 400, as viewed from the top, is in the basic shape of a hexagon, except in two places, each where the two sides of the hexagon would normally join and come to a point (e.g., to form a corner), where there are two, somewhat semi-circular cutouts, each taking away an opposite corner of the hexagon from the other. One or more of the cutouts can be used to facilitate mechanical security of circuit board 400 within LED light bulb 100, for example, by passing a threaded screw (e.g., rivet, bolt, adhesive, etc.) through the cutout into some kind of support structure and tightening the screw head onto circuit board 400 at or adjacent to the inner edge of the cutout(s). Thus, circuit board 400 is said to be substantially in the shape of a hexagon, instead of the star configuration of circuit board 300.

In certain embodiments, FIG. 4 illustrates at least two upper layers of circuit board 400. Not shown in FIG. 4 (but illustrated in Figures, below) are one or more lower layers of circuit board 400, which may include a bottom layer or base layer of some thermally conductive material and a next-to-bottom layer or dielectric layer of an insulator material. Additionally not shown are various possible vias, through-holes and/or other inter-layer connections or contact areas that may exist. The top exposed conductive region(s) of circuit board 400 is illustrated with solid lines in FIG. 4, while the next-to-top, covered conductive region(s) (e.g., covered by a solder mask, etc.) is illustrated with dashed lines in FIG. 4.

In certain embodiments, there are two external, or exposed by the top layer, connection pads 410A-B as part of circuit board 400 shown in FIG. 4. Connection pads 410 can be used for connecting (using solder, conductive adhesive, etc.) electrical conductors (wires, pins, etc., not shown) that extend externally from circuit board 400 and can, for example, supply power and/or signaling to circuit board 400. Towards the middle of circuit board 400, and also exposed by the top layer of circuit board 400, is a thermal pad 420. Thermal pad 420 can pass heat to the thermally conductive material on the bottom of circuit board 400, for example, from the bottom of a mounted LED diode or LED array. On two sides of thermal pad 420 there are two (one on each side) exposed conductive pads 430A-B. Conductive pads 430 can be used, for example, to connect with and supply power to a mounted LED diode or LED array. Finally, the remainder of the top layer of circuit board 400, which covers the non-exposed pad area of circuit board 400, can be some sort of insulator or non-conductive material (i.e., a solder mask), which can provide electrical insulation (i.e., along the top layer) to help protect the separate connection pads 410 from being short circuited to each other, conductive pads 430, thermal pad 420 and/or the base layer via an edge of circuit board 400. Such short circuiting might occur if a metal object (e.g., LED, LED array, screw, rivet, etc.) were improperly placed on top of circuit board 400 or if contamination (e.g., dust, dirt, grease, etc.) were to settle on circuit board 400.

In certain embodiments and at a layer beneath the solder mask layer of circuit board 400, is a trace layer, which is illustrated in FIG. 4 with dashed lines and hash marked area in-fill. As shown in FIG. 4, conductive traces 460A and 460B are laid out such that they are underneath and interconnected with the exposed areas of the solder mask layer that define each connection pad 410A and 410B and each conductive pad 430A and 430B, respectively. Also shown is a single thermal trace 450, part of which is exposed by the solder mask layer and defines thermal pad 420.

In certain embodiments during operation, circuit board 400 can have, for example, an LED diode or LED array mounted on it such that electrical contacts on the underside of the LED diode or array align with and are electrically coupled to conduction pads 430A-B, and such that thermal contact(s) on the underside of the LED align with and is(are) thermally coupled to thermal pad 420. In this way, external power that is supplied to connection pads 410A-B will be transmitted to the LED via electrical traces 460A-B and conduction pads 430A-B, and heat created during LED operation can be dissipated through thermal pad 420 to the bottom, thermally conductive layer (not shown).

In certain embodiments, circuit board 400 may have general dimensions that in some regards are similar to those of circuit board 300 of FIG. 3, with at least the exception that each connection pad 410A-B is at least 2.4 mm away from the respective outer edge of circuit board 400. Alternatively, or in addition to, circuit board 400 may have some or all of the following dimensions. The maximum surface dimension (measured from one outside flat edge, through the center, to the opposite outside flat edge) may be about 19.92 mm+/−0.20 mm, or approximately 20 mm. Each connection pad 410A-B may have a width of about 2.00 mm+/−0.25 mm and a length of about 2.00 mm+/−0.25 mm. Each conduction pad's outer edge may be about 3.46 mm+/−0.25 mm away from the respective outer edge of circuit board 400, and be approximately centered along a midpoint of the respective outer edge of circuit board 400. Additionally, the separation between each conduction pad 430A-B and the nearest connection pad 410A-B to it (at either end of conduction pads 430A-B) may be about 1.70 mm+/−0.25 mm, and the separation between each conduction pad 430A-B and thermal pad 420 may be about 0.50 mm+/−0.25 mm. Finally, total thickness of circuit board 400 may be about 1.60 mm+/−0.25 mm.

In certain embodiments, for non-isolated, mains powered applications, circuit board 400 can pass an electrical strength test, which includes testing at about 1240 VAC. Because of the separation of connection pads 410A-B from the edges of circuit board 400, electrical arcing will not occur during the non-isolated, mains powered, electrical strength test from the connection pads 410A-B, over the top solder mask layer, to the bottom thermal layer of circuit board 400. Thus, circuit board 400 will not pose a safety risk or shock hazard to a user of the device. However, because of the proximity of conduction pads 430A-B to thermal pad 420, electrical arcing may occur between them during the non-isolated, mains powered, electrical strength test (See discussion for FIG. 6), which can be considered a non-safety issue and/or a testing anomaly. Thus, circuit board 400 may be better suited for use in non-isolated, mains powered, LED lighting applications than circuit board 300.

Figure 5:
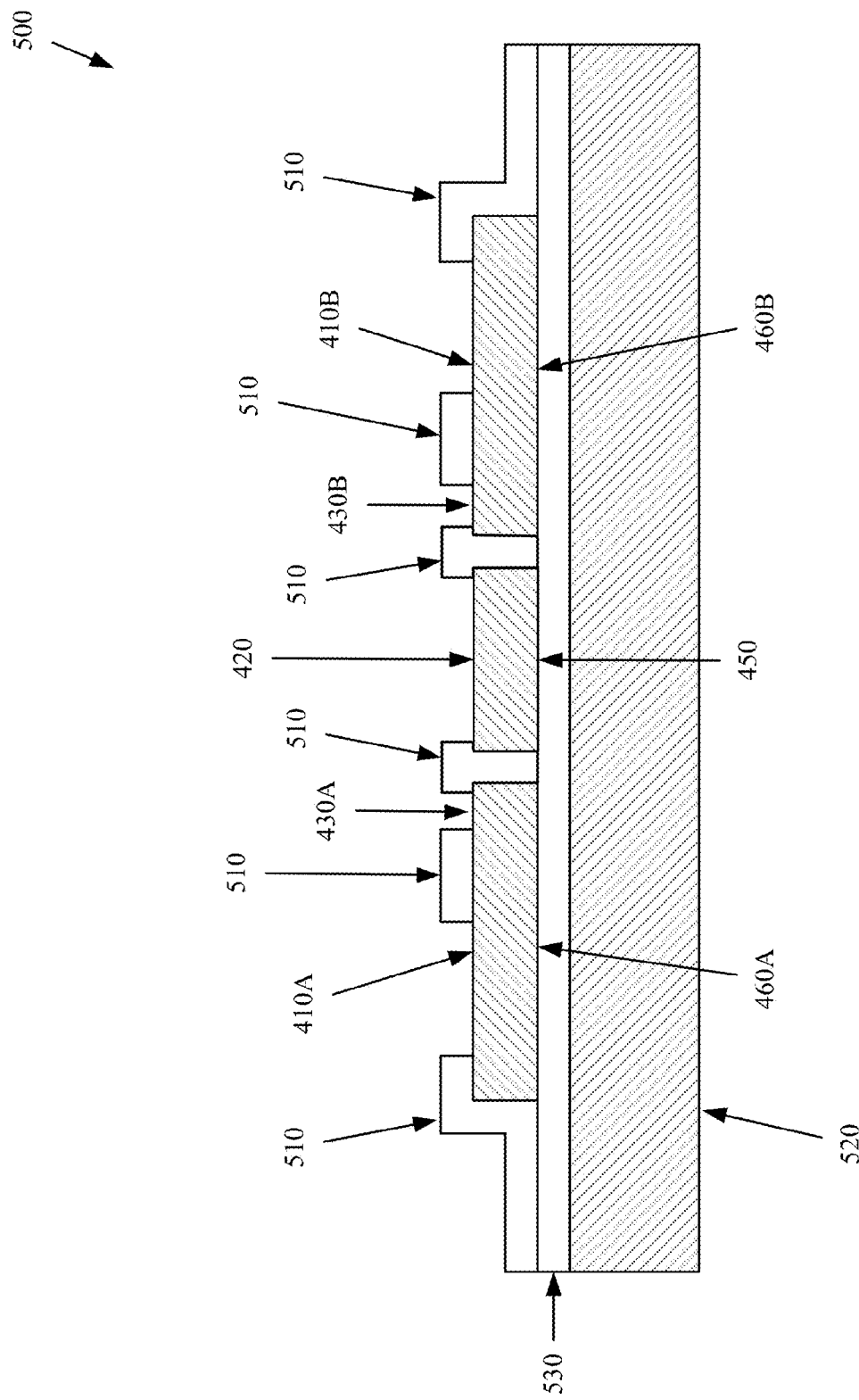
FIG. 5 illustrates a cut-away, side view of the exemplary LED circuit board of FIG. 4 according to certain embodiments of the disclosure.

FIG. 5 illustrates a cut-away, side view 500 of exemplary LED circuit board 400, as shown in FIG. 4 along cut line A-A, according to certain embodiments of the disclosure (not to scale). As shown in FIG. 5, the crosshatch areas, or layers, are conductive material (e.g., either thermal and/or electrical) and the non-crosshatch areas, or layers, are insulator material (e.g., solder mask, dielectric, etc.).

In certain embodiments, as shown in FIG. 5, a base layer 520 (e.g., a metal substrate) can make up the bottom of circuit board 400 and consist of, for example, aluminum, copper, and silica-containing materials. Above base layer 520 can be an insulation layer 530 (e.g., a dielectric), which completely, or almost completely, covers base layer 520. The next layer of circuit board 400 may be the trace layer, having electrical traces 460A-B and thermal trace 450. The exposed pads 410A-B, 430A-B and 420 are at the top of circuit board 400. The remaining portion on top of and around the traces of the trace layer and defining the exposed portions of the traces, e.g., the pads, may be solder mask insulation material 510.

Figure 6:
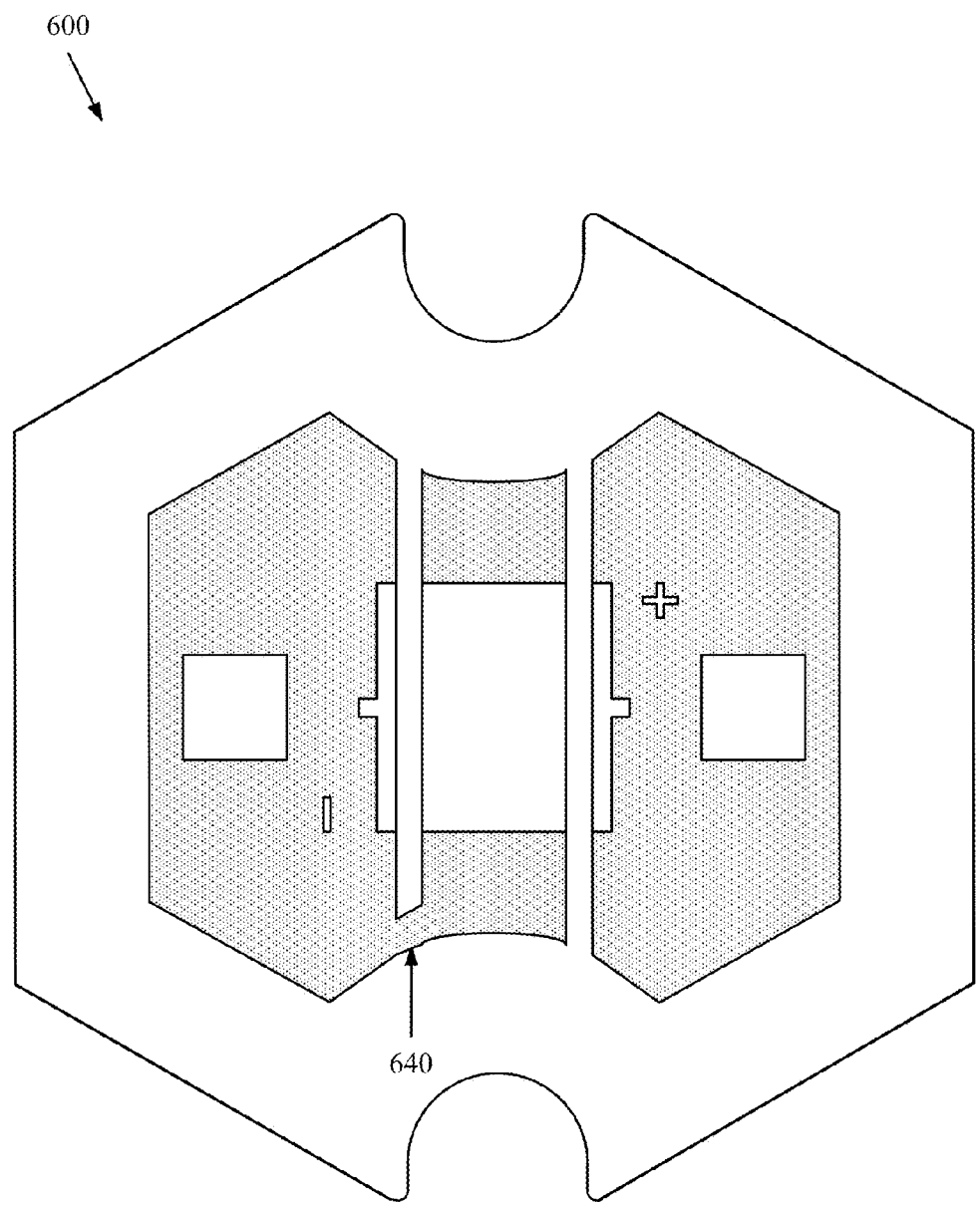
FIG. 6 illustrates a top view of an exemplary LED circuit board that may be used in an LED light bulb or tube according to certain embodiments of the disclosure.

As previously mentioned, because of the proximity of conduction pads 430A-B to thermal pad 420, electrical arcing may occur between them during the non-isolated, mains powered, electrical strength test. However this type of arcing should not pose a safety risk, as it would be internal to the device. FIG. 6 illustrates a top view of an exemplary LED circuit board 600 that may be used in LED light bulb 100 according to certain embodiments of the disclosure.

In certain embodiments and as shown in FIG. 6, circuit board 600 may be very similar to circuit board 400, but with the addition of a bridge trace 640 that connects one of the electrical traces, in this illustration, the electrical trace with the lower potential (i.e., the negative potential for the LED array), to the thermal trace. Bridge trace 640 may be covered with solder mask, as with the rest of the non-exposed, non-pad areas. In this manner, the potential for arcing between the conduction pads and the thermal pad is reduced. Alternatively, a jumper may have been placed to connect the thermal pad 640 to the positive trace without loss of performance of the device. It does not matter to which trace the thermal pad is connected, or exactly where or how it is connected, so long as it is connected to one of the traces.

FIGS. 7-12 illustrate various views of an exemplary LED circuit board that may be used in an LED lighting application according to certain embodiments of the disclosure. While specific dimensions and specific layer layouts are shown and discussed in relation these Figures, it is noted that this application is intended to cover the more general concepts disclosed herein, and is not meant to be limited by any specific layout and/or dimension illustrated.

In certain embodiment, in relation to FIGS. 7-12, a circuit board, similar to circuit boards 400 and/or 600, can consist of at least four layers: a base, thermally conductive material layer, an insulator (or isolation, dielectric, etc.) layer, a metal, trace or conductive layer and a top solder mask layer. As previously disclosed with reference to the top layer of circuit boards 400 and/or 600, the disclosed pads can be part of the trace layer of FIGS. 7-12, where the pads are exposed parts of the metal layer after the solder mask layer has been disposed on top of the metal layer.

Figure 7:
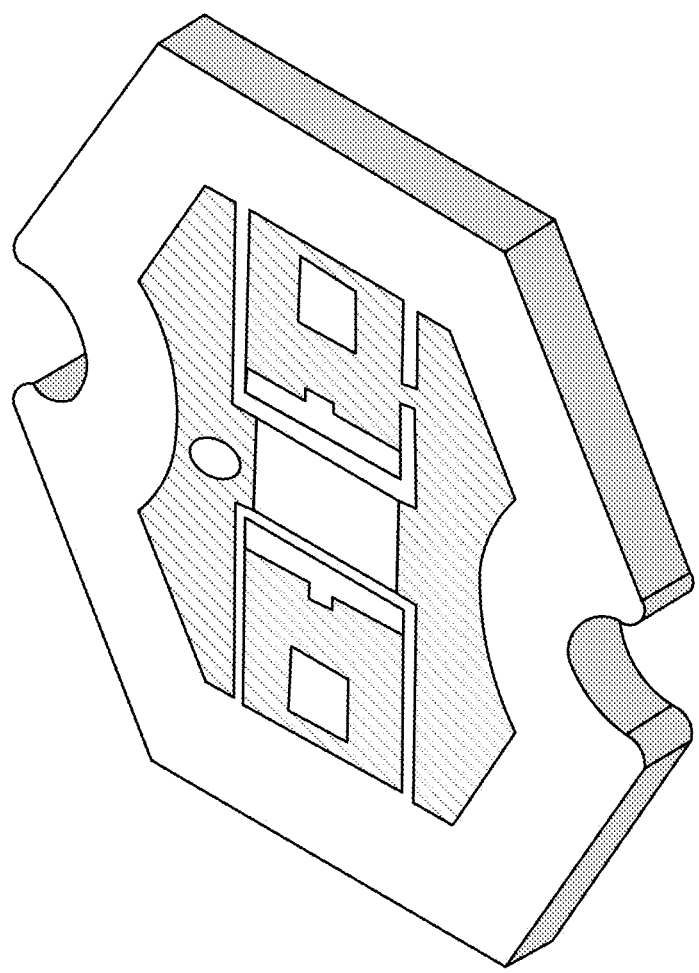
FIG. 7 illustrates an isometric view of an exemplary LED circuit board that may be used in an LED light bulb or tube according to certain embodiments of the disclosure.

FIG. 7 illustrates an isometric view 700 of an exemplary LED circuit board that may be used in an LED light bulb or tube according to certain embodiments of the disclosure. The various layers, materials, layouts and dimensions of the circuit board will be discussed in further detail with reference to the subsequent Figures.

Figure 8:
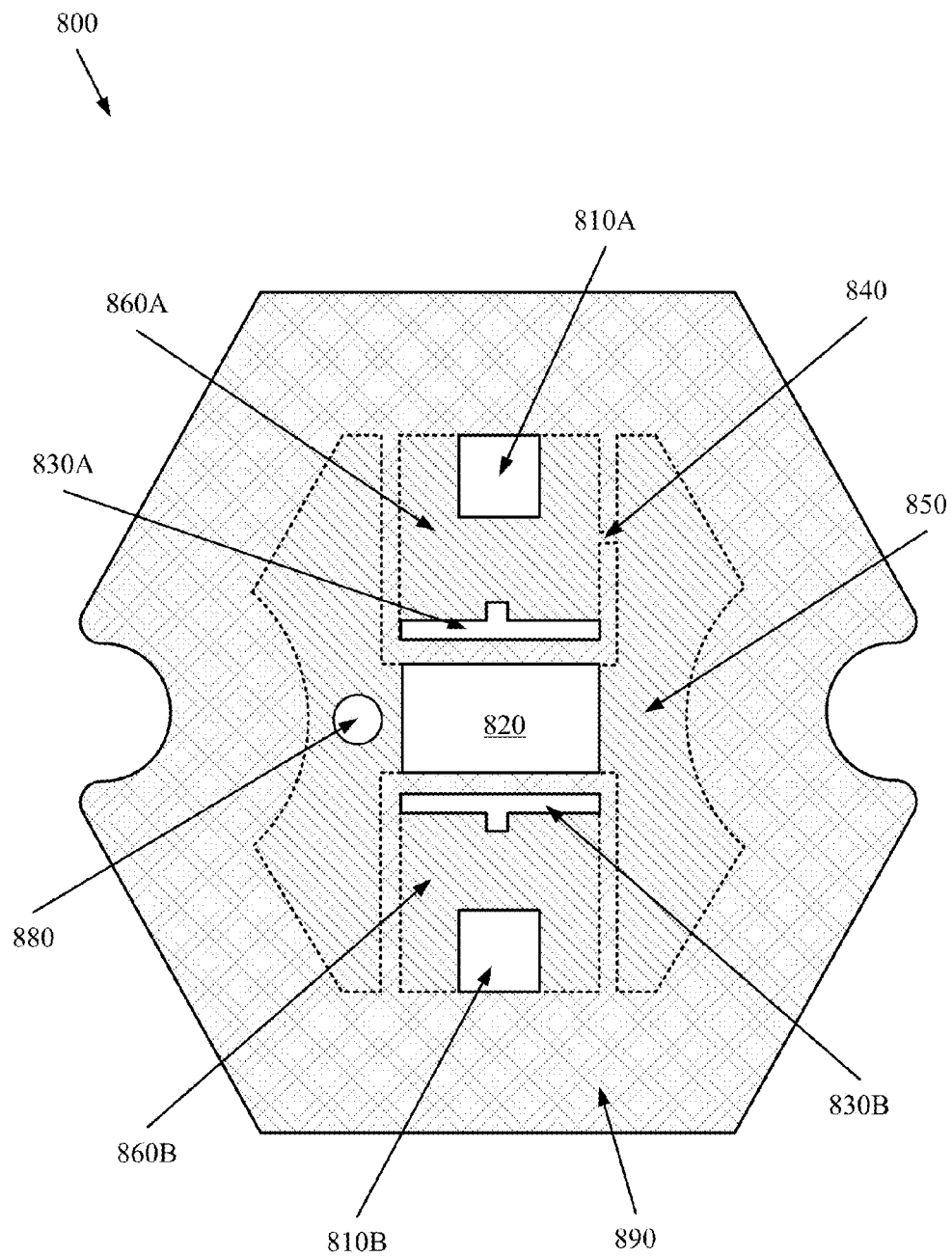
FIG. 8 illustrates a top view of an exemplary LED circuit board that may be used in an LED light bulb or tube according to certain embodiments of the disclosure.

FIG. 8 illustrates a top view 800 of an exemplary LED circuit board that may be used in an LED light bulb or tube according to certain embodiments of the disclosure. Much of the general discussion with reference to FIGS. 4-6 is applicable to FIG. 8, and will not be repeated here. However, as shown in FIG. 8, two connection pads 810A-B are exposed through a top solder mask layer 890. Likewise, two conductive pads 830A-B are exposed through top solder mask layer 890. A thermal pad 820 is also exposed through top solder mask layer 890. Additionally, a test pad 880 may also be exposed through top solder mask layer 890. Remainder of the top layer, besides the exposed pads, of top view 800 can be made up of top solder mask layer 890. Beneath the exposed pads and at least some of the non-exposed area underneath top solder mask layer 890 are electrical traces 860A-B and thermal trace 850, as well as bridge trace 840.

Figure 9:
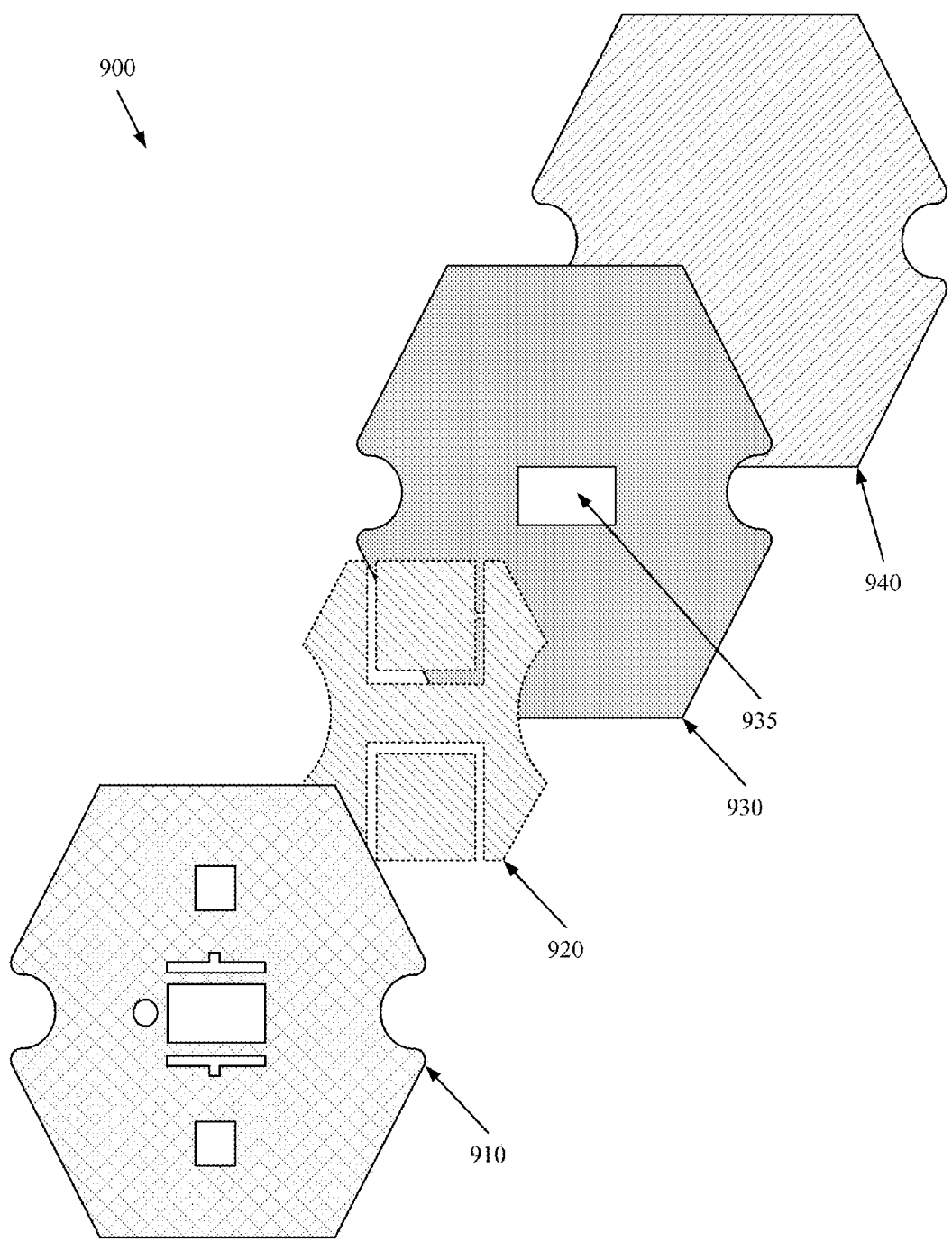
FIG. 9 illustrates an exploded-layer, top view of an exemplary LED circuit board that may be used in an LED light bulb or tube according to certain embodiments of the disclosure.

FIG. 9 illustrates an exploded-layer, top view 900 of an exemplary LED circuit board that may be used in an LED light bulb or tube according to certain embodiments of the disclosure. As shown in FIG. 900, a circuit board, similar to circuit boards 400 and/or 600, can consist of at least four layers: a top solder mask layer 910, a trace (or metal, conductive, etc.) layer 920, a dielectric (or isolation, insulator, etc.) layer 930 and a base thermally conductive material layer 940. In certain embodiments, solder mask layer 910 can be patterned to cover the entire circuit board top except for the desired pad areas, which can remain exposed. Trace layer 920 can be patterned to form the desired connections (electrical and/or thermal) between and/or among the various exposed pads and/or other layers, after the top solder mask layer has been created. Additionally, trace layer 920 can include one or more bridge traces to electrically couple two or more of the other traces.

In certain embodiments, as shown in FIG. 9, dielectric layer 930 may cover the entire surface of base layer 940; with the exception of a central area 935 through which a thermal coupling may be made between central portions of trace layer 920 and base layer 940. Alternatively, central area 935 may not be included such that dielectric layer 930 covers the entire surface of base layer 940. Dielectric layer 930 may have a thermal conductivity of at least approximately 5 Watts per meter Kelvin (W/mK) and a voltage withstand of at least 1240 volts AC (VAC). Dielectric layer 930 may have a thickness of approximately 0.030 mm minimum. Finally, base layer 940 may be the relatively thickest of all the layers and provide mechanical support for the rest of the layers, as well as thermal conductivity for the finished product.

Figure 10:
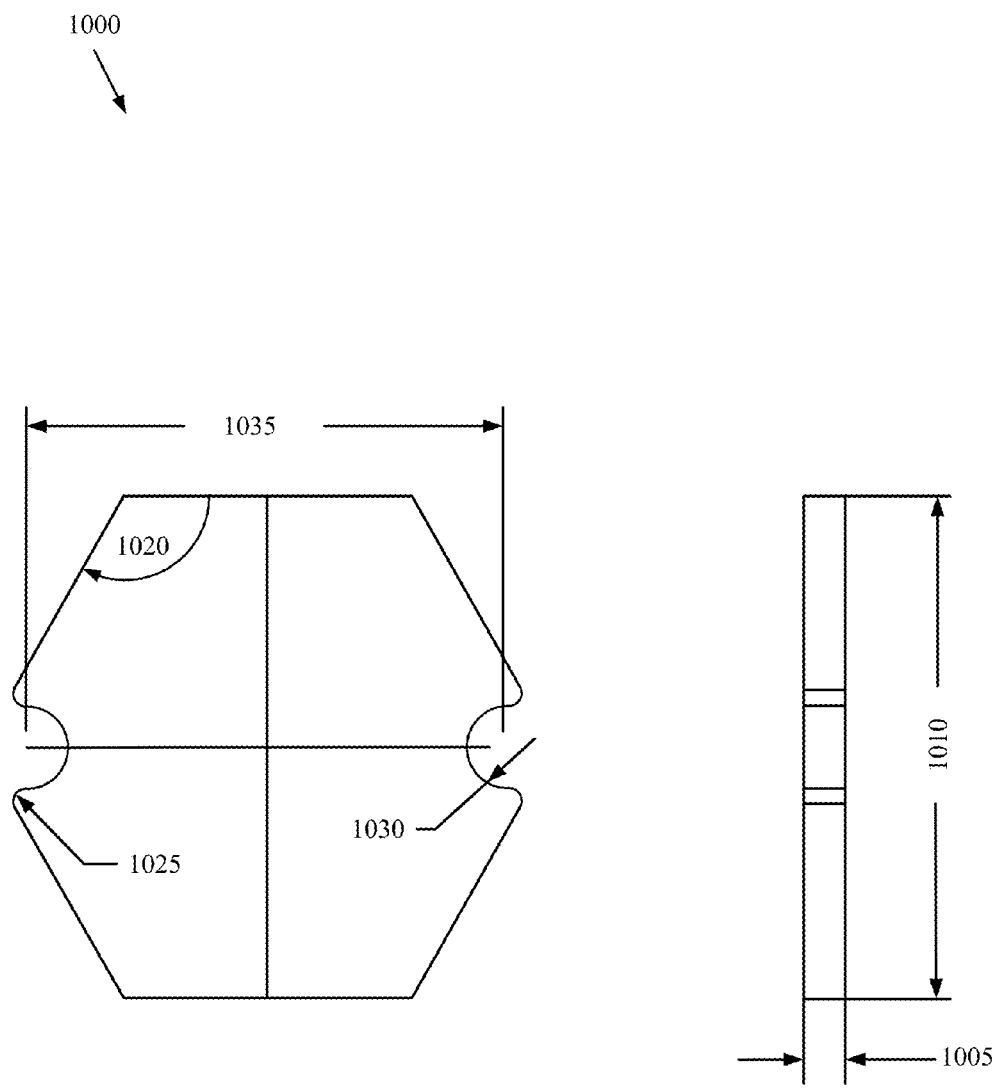
FIG. 10 illustrates a base material layer top and side view within an exemplary LED circuit board that may be used in an LED light bulb or tube according to certain embodiments of the disclosure.

FIG. 10 illustrates a base layer 1000 (e.g., thermally conductive material) top and side view within an exemplary LED circuit board that may be used in an LED light bulb or tube according to certain embodiments of the disclosure. As shown in FIG. 10, base layer 1000 may be made of aluminum, copper, and silica-containing materials, and have a thickness 1005 of approximately 1.60 mm+/−0.15 mm, and a width 1010, as measured perpendicularly from side to an opposite side, of approximately 19.92 mm+/−0.20 mm.

In certain embodiments, the four corners (not including the corners what have been "cutout") each makes an angle 1020 of approximately 120 degrees. Each corner cutout of base layer 1000 can be constructed with two small rounded cuts 1025, each having a radius of approximately 0.50 mm, and one large rounded cut 1030 having a radius of approximately 1.60 mm. Each corner cutout is approximately symmetric, or a mirror image, of the other, with a distance 1035 between the centers of the two large rounded cuts 1030 being approximately 19.00 mm.

Figure 11:
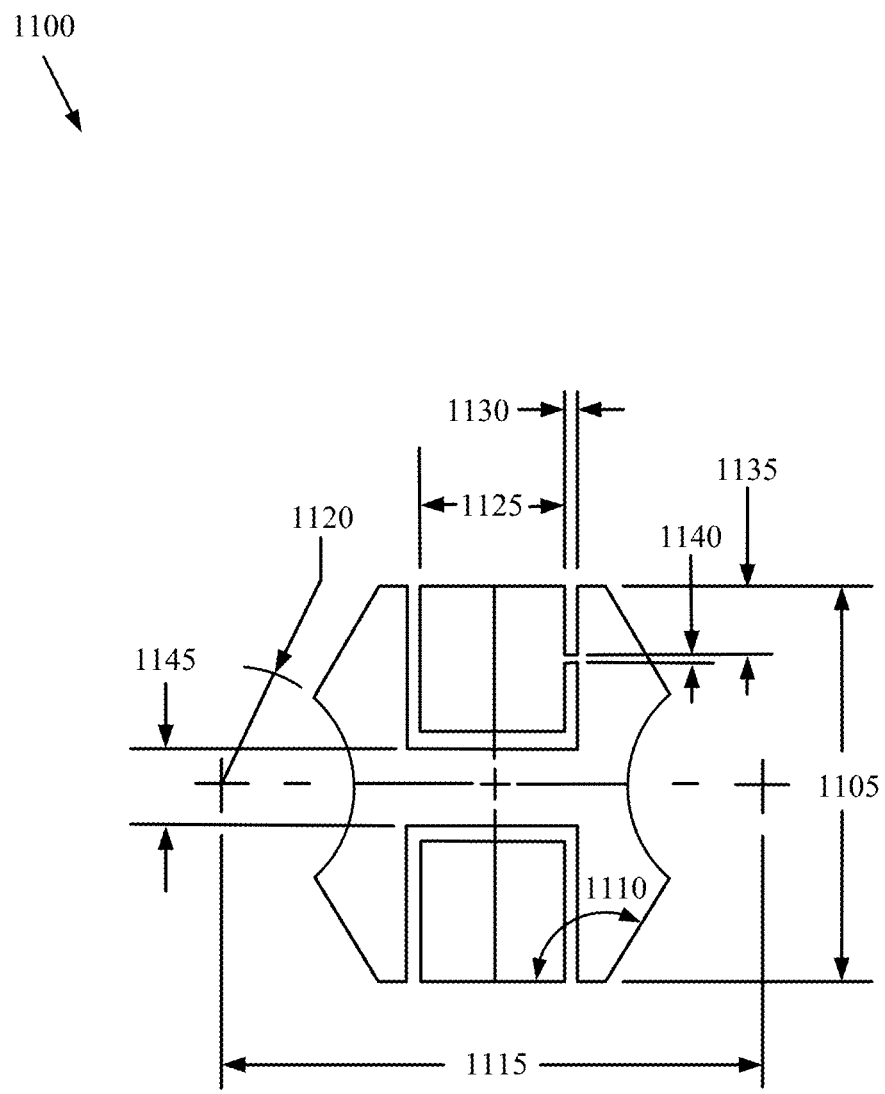
FIG. 11 illustrates a metal or trace layer top view within an exemplary LED circuit board that may be used in an LED light bulb or tube according to certain embodiments of the disclosure.

FIG. 11 illustrates a metal layer 1100 top view within an exemplary LED circuit board that may be used in an LED light bulb or tube according to certain embodiments of the disclosure. Side to side length 1105 of metal layer 1100 can be approximately 13.92 mm, or approximately 6.00 mm less than the side to side length of base layer 1000. The four corners (not including the two large corner cutouts) each can make an angle 1110 of approximately 120 degrees. The two, large corner cutouts are centered 1115 approximately 19.00 mm from each other (and centered along a centerline of metal layer 1100) and each can have a radius 1120 of approximately 4.60 mm.

In certain embodiments, as shown in FIG. 11, the two sides not affected by the cutouts each include approximately square electrical traces. The sides of the electrical traces can have a length 1125 of approximately 5.00 mm. A gap 1130 exists around each pad (with one exception, discussed below) of approximately 0.50 mm in width. The exception to this gap is a bridge trace that is approximately in the middle 1135 (or approximately 2.32 mm from the outer edge of metal layer 1100, of one side of one of the pads. The bridge can have a width 1140 of approximately 0.30 mm. The interior width 1145 of metal layer 1100, as measured between the interior most edges of opposing gaps, can be approximately 2.80 mm.

Figure 12:
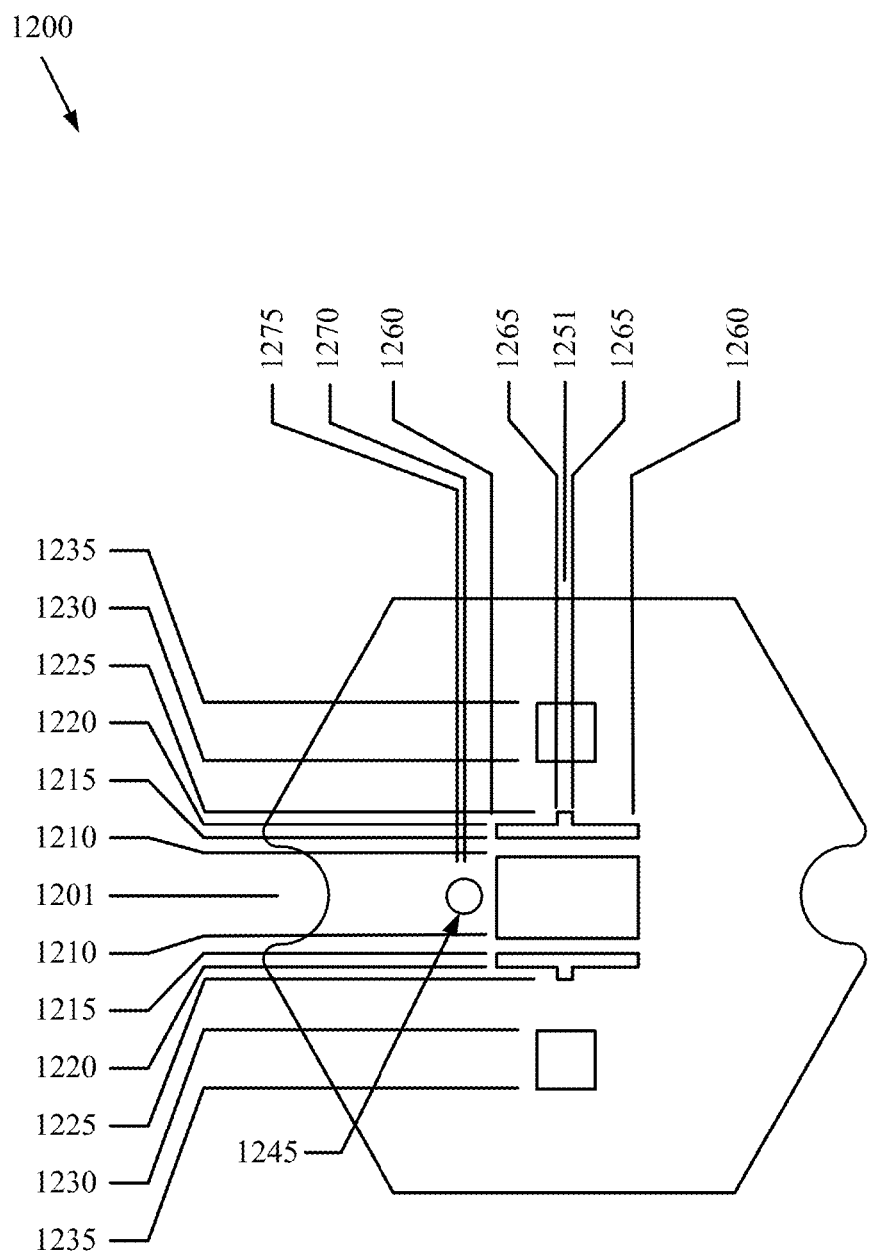
FIG. 12 illustrates a solder mask layer top view within an exemplary LED circuit board that may be used in an LED light bulb or tube according to certain embodiments of the disclosure.

FIG. 12 illustrates a solder mask layer 1200 top view within an exemplary LED circuit board that may be used in an LED light bulb or tube according to certain embodiments of the disclosure. Solder mask layer 1200 has exterior dimensions that will approximately match the exterior dimensions of base layer 1000. As shown FIG. 12, most measurements are provided relative to two center lines 1201 and 1251. Center line 1201 approximately bisects solder mask layer 1200 through the centers of the two circular cutouts. Center line 1251 approximately bisects solder mask layer 1200 and is approximately perpendicular to center line 1201.

In certain embodiments, a rectangular thermal pad void is present near the center of solder mask 1200. The sides of thermal pad void are approximately parallel to center lines 1201 and 1251, with two sides 1210 being approximately 1.40 mm away from center line 1201 and two sides 1260 being approximately 2.40 mm away from center line 1251. Approximately parallel to each of the longer sides of the thermal pad void are two (one along each side) conductor pad voids, which are also approximately centered along center line 1251. Each conductor pad void is approximately the same length as the thermal pad void, with an ending edge 1260 also approximately 2.4 mm away from center line 1251. The distance between center line 1201 and the inner long edge 1215 of each conductor pad void is approximately 1.90 mm. The outer edges 1220 and 1225 vary from approximately 2.40 mm to approximately 2.80 mm, respectively, away from center line 1201. Each conductor pad void has a small square area that protrudes outward, away from center line 1201, each protrusion being approximately centered along center line 1251, having side edges each approximately 0.25 mm away from, and approximately parallel with, center line 1251.

In certain embodiments, two connection pad voids are each approximately centered along center line 1251 and are approximately square in shape. Each connection pad void has an inner edge approximately parallel to center line 1201 and each inner edge 1230 is approximately 4.50 mm away from center line 1201. Each outer edge 1235 of each connection pad void is approximately 6.50 mm away from center line 1201 (making each connection pad an approximate square with sides of approximately 2.00 mm in length). Finally, a test pad void may be approximately circular in shape and centered approximately along center line 1201, and with a radius of approximately 0.50 mm. The center 1270 to 1275 of the test pad void may be from approximately 3.25 mm to approximately 3.50 mm away from center line 1251.

In certain embodiments, as shown in FIGS. 7-12, at least some of the specific shapes and sizes of illustrated and described are not critical to the ideas presented within this application. For example, the text pad void shown in FIG. 12 could be a square or a triangle, or the bridge trace shown in FIG. 11 could be 0.50 mm in width. All of these variations to the specific sizes and shapes illustrated in FIGS. 7-12 are intended to be within the scope of this application.

While certain embodiments are described with respect to particular form-factors and dimensions, those skilled in the art will recognize from the teachings that the ideas within this application are applicable to many different form factors, each have a variety of possible dimensions. Thus, the scope of this application is intended to cover the core ideas regardless of whether a particular embodiment has been disclosed within the application. For example, a circuit board may be somewhat larger across or a little smaller. It may be a different shape than a general hexagonal shape, such as a circle, square, rectangle and so on. The thickness of the circuit board and any of its constituent layers may be greater or less than the certain embodiments disclosed herein. Also, the materials disclosed are not the only possible materials that may be used within the scope of this application. Note that the dimensions noted herein may be, for example, finished dimensions. Finally, the exact shape and size of the various pads and traces can be varied and still maintain the core ideas disclosed.

The above-described embodiments of this disclosure utilize various materials and layouts. However, other materials and layouts can be utilized, which are too numerous to expound upon in this application. Such materials and layouts are either known in the art or are readily derivable after learning the teachings of this disclosure, and hence, will not be discussed in detail.

The previous description of the disclosed embodiments, and permitted equivalents thereof, is provided to enable any person of ordinary skill in the art to make or use the disclosed ideas. Various modifications and alterations to the embodiments may be apparent to those skilled in the art, while retaining the teachings of this application. Such modifications and alterations, to the extent claimed below, are intended to fall within the scope of coverage of this application.

What is claimed is:

1. A circuit board on which to mount a light emitting device (LED), the circuit board comprising:
    a base layer;
    a dielectric layer disposed on the base layer;
    a trace layer disposed on the dielectric layer, the trace layer comprising:
        a plurality of electrical traces each having at least one pad area having a connection pad for electrically coupling a power source to the LED,
        a thermal trace, and
        a bridge trace coupling at least one of the plurality of electrical traces to the thermal trace, wherein the bridge trace has a width of approximately 0.30 mm, and wherein the bridge trace covers a gap between the thermal trace and one of the electrical traces of approximately 0.5 mm; and
    a solder mask disposed over the bridge trace,
    wherein the circuit board is substantially hexagonal in shape and each of the connection pads is positioned at least 2.4 mm away from an outer edge of the circuit board.

2. The circuit board of claim 1, wherein the circuit board has a width, measured perpendicularly between opposing sides of the board shape, of approximately 20 mm.

3. The circuit board of claim 1, wherein the solder mask layer is disposed on top of the trace layer.

4. The circuit board of claim 1, wherein the base layer is a thermally conductive material.

5. The circuit board of claim 4, wherein the thermally conductive material is selected from a group including aluminum, copper and silica-containing materials.

6. The circuit board of claim 1, wherein the dielectric layer is a dielectric material and has a dielectric thickness preselected based at least on an electric strength needed for passing an electrical strength test.

7. The circuit board of claim 6, wherein the dielectric layer has a thermal conductivity and a voltage withstand that are designed to pass the electrical strength test.

8. The circuit board of claim 7, wherein the thermal conductivity is at least approximately 5 W/mK and the voltage withstand is at least approximately 1240 VAC.

9. The circuit board of claim 1, wherein the trace layer is a conductive material selected from a group including copper, nickel, aluminum and silver.

10. The circuit board of claim 1, wherein the trace layer further comprises additional pad areas including additional connection pads configured for electrical coupling the LED and a thermal pad for thermal coupling to the LED.

11. The circuit board of claim 10, wherein the solder mask layer is an insulating material and at least partially exposes the plurality of pad areas of the trace layer.

12. The circuit board of claim 10, wherein the bridge trace reduces the potential for arcing between the plurality of first connection pads and the thermal pad.

13. The circuit board of claim 12, further comprising an approximately 0.50 mm space between one of the plurality of the first connection pads and the thermal pad.

14. The circuit board of claim 1, wherein the circuit board is configured to pass a non-isolated, mains powered, electrical strength test, and wherein the non-isolated, mains powered, electrical strength test includes withstanding a voltage of at least approximately 1240 VAC without producing an electrical arc between or among various portions of the plurality of layers of the circuit board.

15. A circuit board on which to mount a light emitting device (LED), comprising:
a substantially hexagonal board shape, wherein the board shape has a board width, measured perpendicularly between opposing sides of the board shape, of approximately 20 mm; and
a plurality of layers, comprising:
a base layer, wherein the base layer is a thermally conductive material,
a dielectric layer, disposed on top of the base layer, wherein the dielectric layer is a dielectric material and has a dielectric thickness preselected based at least on an electric strength needed for passing an electrical strength test,
a trace layer, disposed on top of the dielectric layer, wherein the trace layer is a conductive material and includes a plurality of electrical traces, a thermal trace, and a bridge trace coupling at least one of the plurality of electrical traces to the thermal trace, and
a solder mask layer, disposed on top of the trace layer, wherein the solder mask layer is an insulating material and at least partially exposes a plurality of pad areas of the trace layer, and wherein the solder mask layer is disposed over the bridge trace,
wherein the bridge trace has a width of approximately 0.30 mm and covers a gap between the thermal trace and one of the electrical traces of approximately 0.50 mm.

16. The circuit board of claim 15, wherein the dielectric layer has a thermal conductivity and a voltage withstand that are designed to pass an electrical strength test.

17. The circuit board of claim 16, wherein the thermal conductivity is at least approximately 5 W/mK and the voltage withstand is at least approximately 1240 VAC.

18. The circuit board of claim 15, wherein the plurality of pad areas includes:
a plurality of first connection pads configured for electrical coupling to the LED;
a plurality of second connection pads configured to electrically couple a power source to the LED; and
a thermal pad configured for thermal coupling to the LED.

19. The circuit board of claim 18, wherein the plurality of second connection pads are positioned at least 2.4 mm away from an outer edge of the circuit board.

20. The circuit board of claim 15, wherein the non-isolated, mains powered, electrical strength test includes withstanding a voltage of approximately 1240 VAC without producing an electrical arc between or among various portions of the plurality of layers of the circuit board.

* * * * *